(12) United States Patent
Chang et al.

(10) Patent No.: US 10,971,610 B2
(45) Date of Patent: Apr. 6, 2021

(54) HIGH ELECTRON MOBILITY TRANSISTOR

(71) Applicant: UNITED MICROELECTRONICS CORP., Hsin-Chu (TW)

(72) Inventors: Chun-Ming Chang, Kaohsiung (TW); Chun-Liang Hou, Hsinchu County (TW); Wen-Jung Liao, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/558,329

(22) Filed: Sep. 3, 2019

(65) Prior Publication Data

US 2021/0036138 A1    Feb. 4, 2021

(30) Foreign Application Priority Data

Aug. 2, 2019  (CN) .......................... 201910710859.4

(51) Int. Cl.
  *H01L 21/306*  (2006.01)
  *H01L 29/20*   (2006.01)
  *H01L 29/66*   (2006.01)
  *H01L 29/778*  (2006.01)

(52) U.S. Cl.
  CPC .... *H01L 29/7783* (2013.01); *H01L 21/30612* (2013.01); *H01L 29/2003* (2013.01); *H01L 29/66462* (2013.01)

(58) Field of Classification Search
  CPC ............. H01L 29/7783; H01L 29/2003; H01L 29/66462; H01L 1121/30612
  USPC .......................................................... 257/192
  See application file for complete search history.

(56) References Cited

U.S. PATENT DOCUMENTS

| 7,728,356 B2 | 6/2010 | Suh | |
| 2012/0056191 A1* | 3/2012 | Endo | H01L 21/8252 257/76 |
| 2013/0075751 A1 | 3/2013 | Imanishi | |
| 2014/0175453 A1* | 6/2014 | Yamada | H01L 29/66462 257/76 |
| 2015/0097194 A1 | 4/2015 | Cheng | |

FOREIGN PATENT DOCUMENTS

JP    2008-98455 A    4/2008

* cited by examiner

*Primary Examiner* — Tong-Ho Kim
(74) *Attorney, Agent, or Firm* — Winston Hsu

(57) ABSTRACT

A high electron mobility transistor (HEMT) includes a substrate; a buffer layer over the substrate, a GaN layer over the buffer layer, a first AlGaN layer over the GaN layer, a first AlN layer over the AlGaN layer, and a p-GaN layer over the first AlN layer.

21 Claims, 4 Drawing Sheets

HIGH ELECTRON MOBILITY TRANSISTOR

BACKGROUND OF THE INVENTION

1. Field of the Invention

The present invention relates to the field of compound semiconductor technology, and more particularly to a gallium nitride (GaN) high electron mobility transistor (HEMT) and a method of fabricating the same.

2. Description of the Prior Art

Gallium nitride high electron mobility transistors (GaN HEMT) are often used in high frequency, high power amplifier components with high breakdown voltage, high electron mobility and saturated carrier velocity, and high temperature operation.

According to the prior art, forming a normally-off GaN HEMT generally requires directly etching a P-type GaN layer, or using a re-growth method to grow an AlGaN (AlGaN) layer on a P-type GaN layer. However, in the above method, directly etching the P-type GaN layer causes etching damage of the underlying AlGaN layer, and the re-growth process step is too complex, the productivity is low, and the cost is too high.

Therefore, there is still a need in the art for an improved GaN HEMT and a method of fabricating the same to solve the above disadvantages and shortcomings.

SUMMARY OF THE INVENTION

The present disclosure provides an improved gallium nitride high electron mobility transistor and a method of fabricating the same that can address the deficiencies and shortcomings of the prior art as described above.

The present disclosure provides a high electron mobility transistor (HEMT) including a substrate, a buffer layer over the substrate, a GaN layer over the buffer layer, a first AlGaN layer over the GaN layer, a first AlN layer over the first AlGaN layer, and a p-type GaN layer over the first AlN layer.

According to some embodiments, the first AlGaN layer is a p-type AlGaN layer or an intrinsic AlGaN layer.

According to some embodiments, the HEMT further comprises a gate recess over the first AlN layer.

According to some embodiments, the HEMT further comprises a second AlGaN layer over the first AlN layer.

According to some embodiments, the HEMT further comprised a passivation layer over the second AlGaN layer.

According to some embodiments, the passivation layer comprises aluminum nitride, aluminum oxide, silicon nitride, or silicon oxide.

According to some embodiments, the gate recess penetrates through the passivation layer and the second AlGaN layer.

According to some embodiments, the p-type GaN layer is disposed in the gate recess.

According to some embodiments, the p-type GaN layer is in direct contact with the first AlN layer in the gate recess.

According to some embodiments, the gate recess does not penetrate through the first AlN layer, and wherein the gate recess is completely filled with the p-type GaN layer.

According to some embodiments, the HEMT further comprised a gate metal layer on the p-type GaN layer.

According to some embodiments, the gate metal layer comprises nickel, gold, silver, titanium, copper, platinum or alloys thereof.

According to some embodiments, the HEMT further comprises a source metal layer and a drain metal layer penetrating through the passivation layer, the second AlGaN layer, the first AlN layer, the first AlGaN layer, and extending into the GaN layer.

According to some embodiments, the source metal layer and the drain metal layer comprise nickel, gold, silver, platinum, titanium, titanium nitride, or any combination thereof.

According to some embodiments, the second AlGaN layer has a thickness greater than that of the first AlGaN layer.

According to some embodiments, the thickness of the second AlGaN layer between 2 nm and 30 nm, and wherein the thickness of the first AlGaN layer between 2 nm and 10 nm.

According to some embodiments, the HEMT further comprises a second AlN layer on the p-type GaN layer.

According to some embodiments, the second AlGaN layer has aluminum content greater than that of the first AlGaN layer.

According to some embodiments, the aluminum content of the second AlGaN layer between 10% and 50%.

According to some embodiments, the aluminum content of the first AlGaN layer between 0 and 30%.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

The present disclosure provides a GaN HEMT, in particular a normally-off GaN HEMT and a method of fabricating the same, which may have improved electrical properties (e.g., Vt, Ig gain). The method of fabricating the GaN HEMT of the present disclosure can avoid component damage caused by etching. In addition, the GaN HEMT of the present disclosure may achieve the purpose of adjusting the characteristics of the transistor element by using physical properties of a specific layer, for example, a film thickness or a content ratio of a specific element (for example, aluminum).

Figure 1:
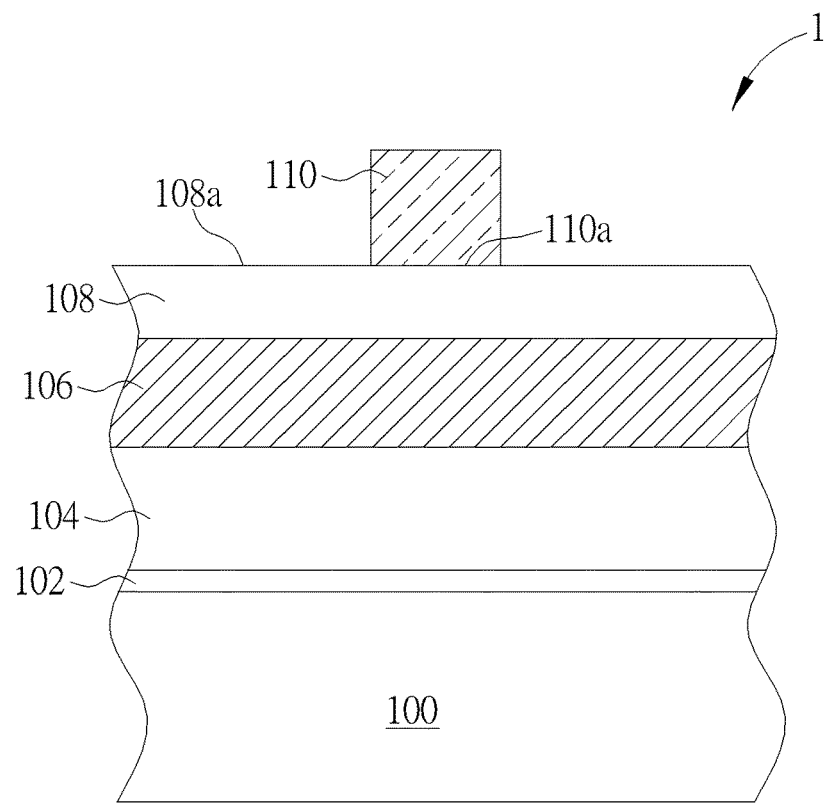
FIG. 1 is a cross-sectional view of a high electron mobility transistor (HEMT) according to an embodiment of the invention.

Please refer to FIG. 1, which is a cross-sectional view of a high electron mobility transistor (HEMT) according to an embodiment of the invention. As shown in FIG. 1, the HEMT 1 includes a substrate 100, a buffer layer 102 disposed on the substrate 100, a GaN channel layer 104 disposed on the buffer layer 102, an AlGaN layer 106 disposed on the GaN channel layer 104, an AlN etch stop layer 108 on the AlGaN layer 106, and a P-type gallium nitride (pGaN) layer 110 disposed on the AlN etch stop layer 108. The substrate 100 may be a semiconductor substrate such as a silicon substrate, a silicon carbide (SiC) substrate or a sapphire substrate, but is not limited thereto. The buffer layer 102 may be a single layer such as aluminum nitride or a multi-layer such as a superlattice structure, but is not limited thereto. In FIG. 1, the bottom surface 110a of the pGaN layer 110 is approximately flush with the upper surface 108a of the AlN etch stop layer 108.

Figure 2:
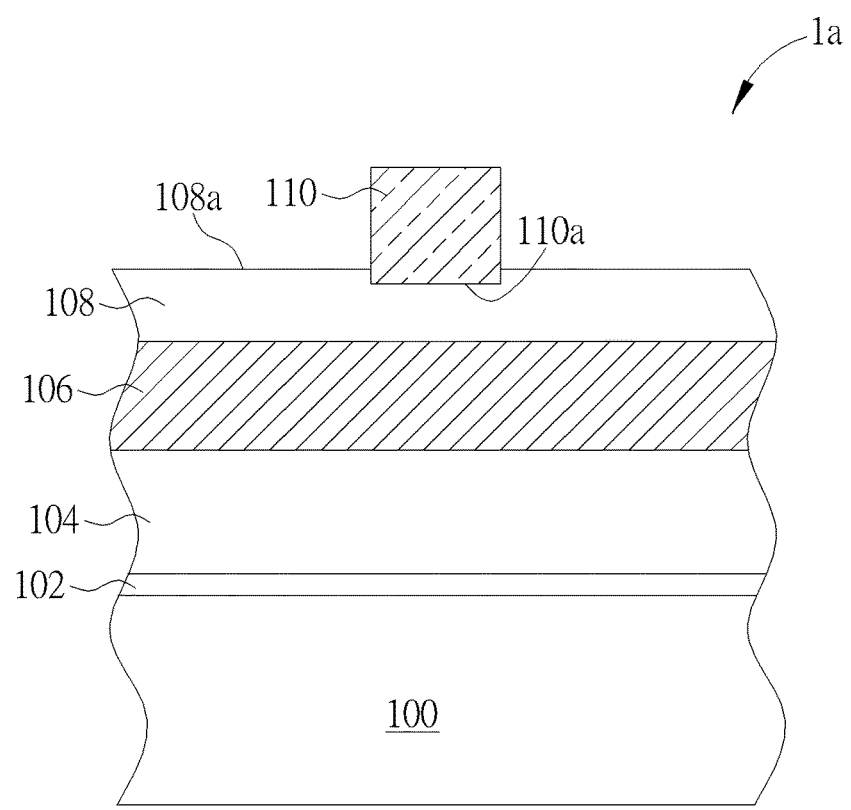
FIG. 2 is a cross-sectional view of a HEMT according to another embodiment of the invention.

Please refer to FIG. 2, which is a cross-sectional view of a HEMT according to another embodiment of the invention. As shown in FIG. 2, the HEMT 1a includes a substrate 100, a buffer layer 102 disposed on the substrate 100, a GaN channel layer 104 disposed on the buffer layer 102, an AlGaN layer 106 disposed on the GaN channel layer 104, an AlN etch stop layer 108 disposed on the AlGaN layer 106, and a pGaN layer 110 disposed on the AlN etch stop layer 108. The substrate 100 may be a semiconductor substrate such as a silicon substrate or a silicon carbide substrate, but is not limited thereto. The buffer layer 102 may be, for example, AlN, but is not limited thereto. In FIG. 2, the bottom surface 110a of the pGaN layer 110 is lower than the upper surface 108a of the AlN etch stop layer 108. In other words, the pGaN layer 110 is slightly recessed in the AlN etch stop layer 108.

Figure 3:
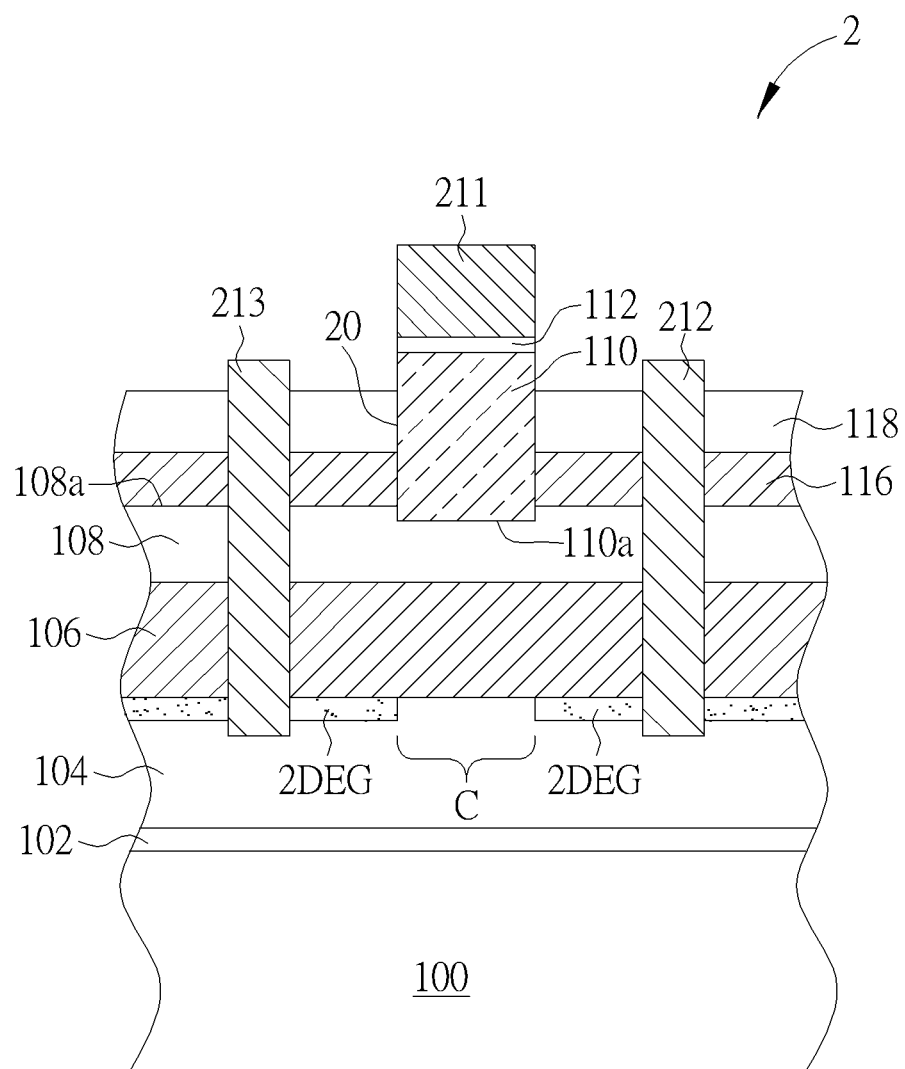
FIG. 3 is a cross-sectional view of a HEMT according to still another embodiment of the present invention.

Please refer to FIG. 3, which is a cross-sectional view of a HEMT according to still another embodiment of the present invention. As shown in FIG. 3, the HEMT 2 also includes a substrate 100, a buffer layer 102 disposed on the substrate 100, a GaN channel layer 104 disposed on the buffer layer 102, an first AlGaN layer 106 disposed on the GaN channel layer 104, an AlN etch stop layer 108 disposed on the first AlGaN layer 106, a second AlGaN layer 116 disposed on the AlN etch stop layer 108, and a passivation layer 118 disposed on the second AlGaN layer 116.

According to an embodiment of the present invention, the substrate 100 may be a semiconductor substrate such as a silicon substrate, a SiC substrate or a sapphire substrate, but is not limited thereto. The buffer layer 102 may be, for example, a single layer of AlN, or a multi-layer, for example, a superlattice structure, but is not limited thereto. The passivation layer 118 may include, for example, aluminum nitride, silicon nitride, aluminum oxide or silicon oxide.

According to an embodiment of the invention, the first AlGaN layer 106 may be a pAlGaN layer, for example, Mg-doped AlGaN layer or intrinsic AlGaN (i-AlGaN) layer. According to an embodiment of the invention, the first AlGaN layer 106 is the sum of the ratio of AlN and the ratio of GaN, and may be represented by $Al_xGa_{1-x}N$, where x is between 0~0.3. For example, the first AlGaN layer 106 may be $Al_{0.1}Ga_{0.9}N$. According to an embodiment of the invention, the second AlGaN layer 116 may be represented by $Al_xGa_{1-x}N$, where x is between 0.1~0.5. For example, the second AlGaN layer 116 may be $Al_{0.2}Ga_{0.8}N$.

According to an embodiment of the invention, the HEMT 2 further includes a gate recess 20 on the AlN etch stop layer 108. According to an embodiment of the invention, the gate recess 20 penetrates through the passivation layer 118 and the second AlGaN layer 116, but the gate recess 20 does not penetrate through the AlN etch stop layer 108.

According to an embodiment of the invention, the HEMT 2 further includes a pGaN layer 110 on the AlN etch stop layer 108. An AlN layer 112 may be disposed on the pGaN layer 110. According to an embodiment of the invention, the pGaN layer 110 is disposed in the gate recess 20. According to an embodiment of the invention, the pGaN layer 110 directly contacts the AlN etch stop layer 108 in the gate recess 20. According to an embodiment of the invention, the gate recess 20 is completely filled by the pGaN layer 110.

In FIG. 3, the bottom surface 110a of the pGaN layer 110 may be slightly lower than the upper surface 108a of the AlN etch stop layer 108. In other words, the pGaN layer 110 may slightly extend into the AlN etch stop layer 108.

According to an embodiment of the invention, a two-dimensional electron gas 2DEG caused by the difference in the lattice constant between the GaN channel layer 104 and the first AlGaN layer 106 is formed at the surface of the GaN channel layer 104 and is adjacent to the first AlGaN layer 106. According to an embodiment of the invention, there is no two-dimensional electron gas generated in the surface depletion region C of the GaN channel layer 104 directly under the pGaN layer 110, thus forming a normally-off GaN HEMT.

According to an embodiment of the invention, the thickness of the second AlGaN layer 116 is greater than the thickness of the first AlGaN layer 106. For example, the thickness of the second AlGaN layer 116 may be between 2 nm and 30 nm, and the thickness of the first AlGaN layer 106 may be between 2 nm and 10 nm. According to an embodiment of the invention, the aluminum content of the second AlGaN layer 116 is greater than the aluminum content of the first AlGaN layer 106. For example, the second AlGaN layer 116 has an aluminum content of 10 to 50%, and the first AlGaN layer 106 has an aluminum content of 0 to 30%.

According to an embodiment of the present invention, a gate metal layer 211 may be further disposed on the pGaN layer 110. For example, the gate metal layer 211 may comprise nickel, gold, silver, titanium, copper, platinum or alloys thereof, but is not limited to this. According to an embodiment of the invention, the HEMT 2 further includes a source metal layer 212 and a drain metal layer 213, passing through the passivation layer 118, the second AlGaN layer 116, the AlN etch stop layer 108, the first AlGaN layer 106, and may extend into the GaN channel layer 104. For example, the source metal layer 212 and the drain metal layer 213 may comprise nickel, gold, silver, platinum, titanium, titanium nitride, or any combination thereof.

Figure 4:
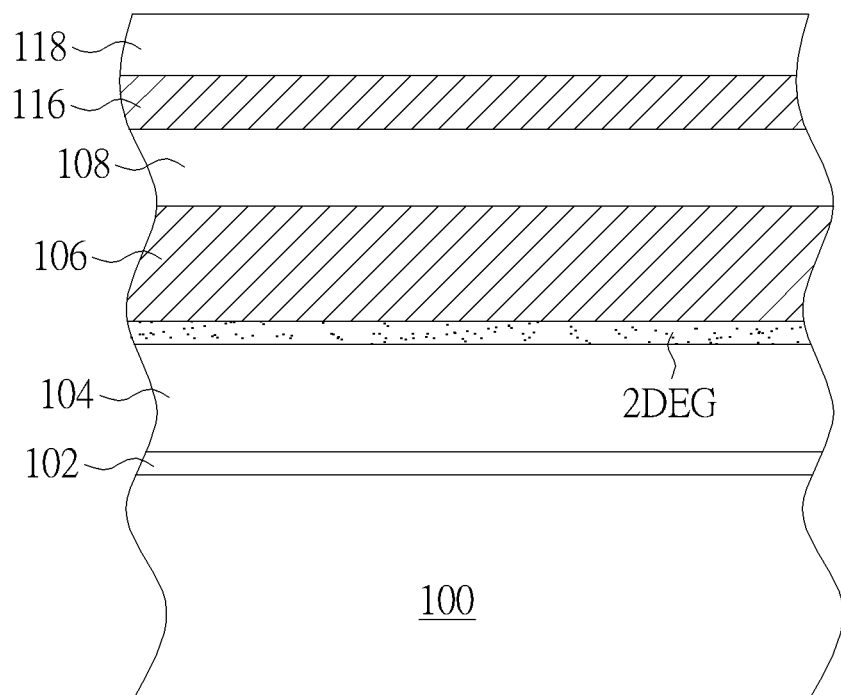
FIG. 4 to FIG. 7 are schematic cross-sectional views showing the fabrication of the HEMT of FIG. 3 according to an embodiment of the invention.

Please refer to FIG. 4 to FIG. 7, which are schematic cross-sectional views showing the fabrication of the HEMT of FIG. 3 according to an embodiment of the invention. As shown in FIG. 4, a substrate 100 is first provided. A buffer layer 102, a GaN channel layer 104, a first AlGaN layer 106, an AlN etch stop layer 108, a second AlGaN layer 116, and a passivation layer 118 may be sequentially formed on the substrate 100 by an epitaxial method. According to an embodiment of the present invention, a two-dimensional electron gas 2DEG caused by the difference in the lattice constant between the GaN channel layer 104 and the first AlGaN layer 106 is formed at the surface of the GaN channel layer 104 and is adjacent to the first AlGaN layer 106

According to an embodiment of the present invention, the substrate 100 may be a semiconductor substrate such as a silicon substrate, a silicon carbide substrate or a sapphire substrate, but is not limited thereto. The buffer layer 102 may be a single layer such as AlN, or a multi-layer such as a superlattice structure, but is not limited thereto. The passivation layer 118 may comprise, for example, aluminum nitride, aluminum oxide, silicon oxide or silicon nitride.

According to an embodiment of the invention, the first AlGaN layer 106 may be a P-type AlGaN (pAlGaN) layer, for example, a Mg-doped AlGaN layer, or an intrinsic AlGaN (i-AlGaN) layer. According to an embodiment of the invention, the first AlGaN layer 106 is a sum of the ratio of AlN and the ratio of GaN, and may be represented by $Al_xGa_{1-x}N$, where x is between 0~0.3. For example, the first AlGaN layer 106 may be $Al_{0.1}Ga_{0.9}N$. According to an embodiment of the invention, the second AlGaN layer 116 may be represented by $Al_xGa_{1-x}N$, where x is between 0.1~0.5. For example, the second AlGaN layer 116 may be $Al_{0.2}Ga_{0.8}N$.

According to an embodiment of the invention, the thickness of the second AlGaN layer 116 is greater than the thickness of the first AlGaN layer 106. For example, the thickness of the second AlGaN layer 116 may be between 2 nm and 30 nm, and the thickness of the first AlGaN layer 106 may be between 2 nm and 10 nm. According to an embodiment of the invention, the aluminum content of the second AlGaN layer 116 is greater than the aluminum content of the first AlGaN layer 106. For example, the second AlGaN layer 116 has an aluminum content of 10% to 50%, and the first AlGaN layer 106 has an aluminum content of 0 to 30%.

Figure 5:
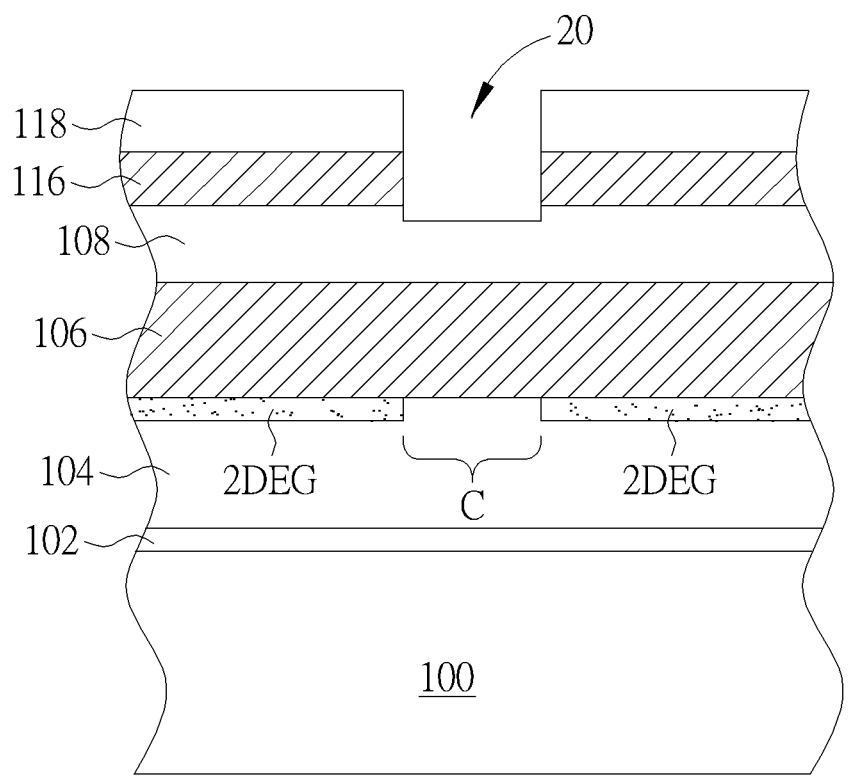

As shown in FIG. 5, a lithography and etching process is then performed to form a gate recess 20 on the AlN etch stop layer 108. According to an embodiment of the invention, the gate recess 20 penetrates through the passivation layer 118 and the second AlGaN layer 116, but the gate recess 20 may not penetrate through the AlN etch stop layer 108. Since the step of etching the gate recess 20 eventually stops on the AlN etch stop layer 108, the underlying first AlGaN layer 106 is not damaged by etching, and therefore, the threshold voltage (Vt) can be improved and the gate leakage can be reduced. At this point, no two-dimensional electron gas is generated in the surface depletion region C of the GaN channel layer 104 directly under the gate recess 20.

Figure 6:
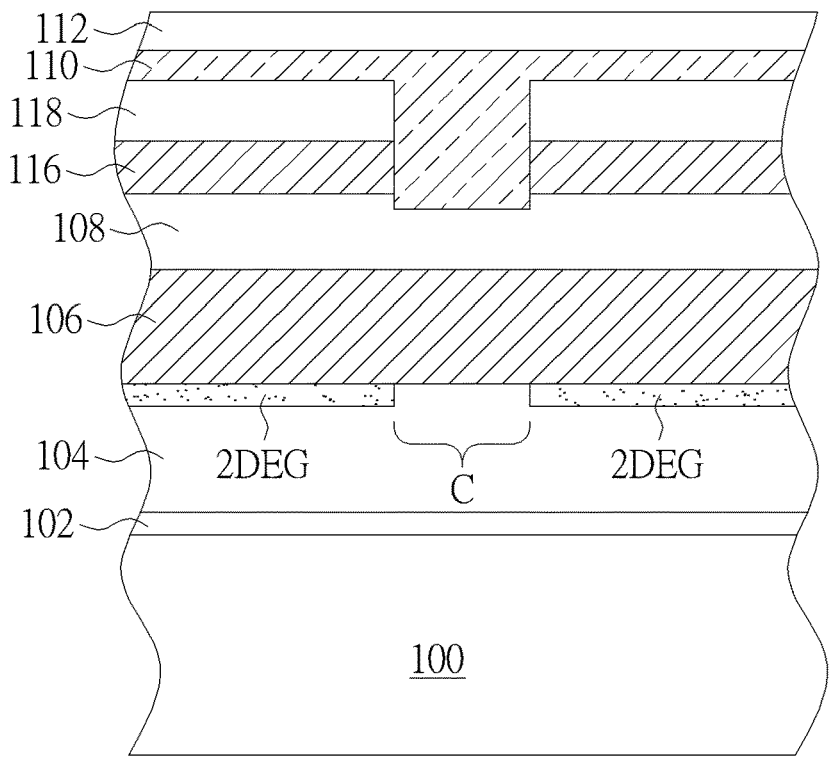

As shown in FIG. 6, an epitaxial process is then performed to form a pGaN layer 110 in the gate recess 20 and the passivation layer 118. In addition, an AlN layer 112 may be formed on the pGaN layer 110. The AlN layer 112 can serve as a protective layer.

Figure 7:
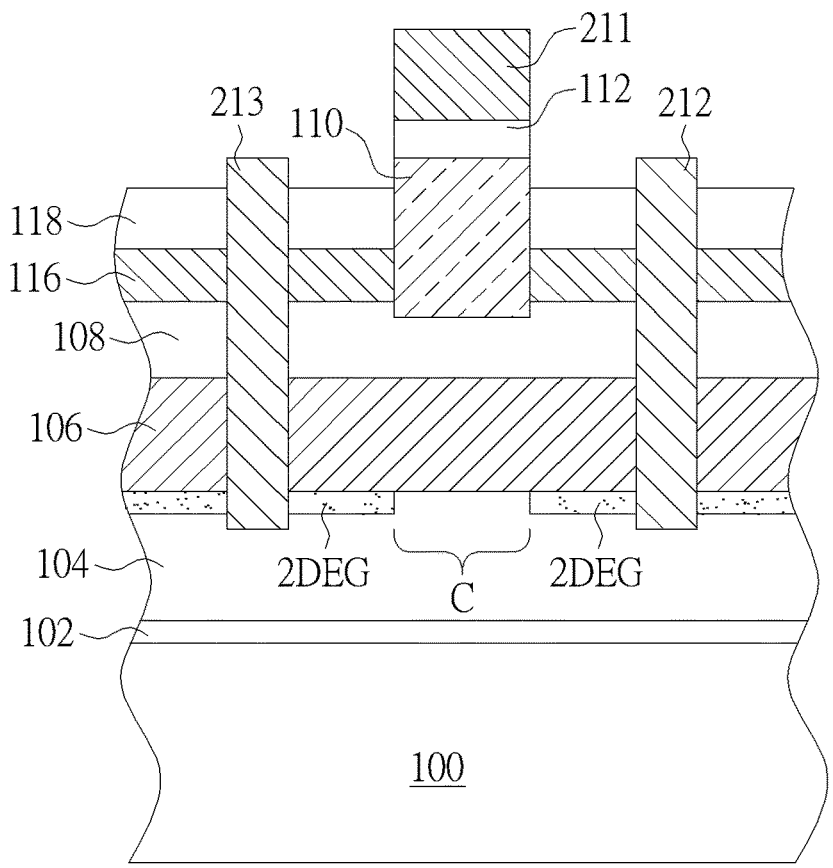

As shown in FIG. 7, a lithography and etching process is performed to etch away the pGaN layer 110 and the AlN layer 112 outside the gate recess 20. After the etching of the pGaN layer 110 and the AlN layer 112 is completed, a portion of the surface of the passivation layer 118 is exposed.

Finally, a gate metal layer 211 is formed on the pGaN layer 110. For example, the gate metal layer 211 may comprise nickel, gold, silver, titanium, copper, platinum or alloys thereof, but is not limited thereto. Then, a source metal layer 212 and a drain metal layer 213 are formed. The source metal layer 212 and the drain metal layer 213 penetrate through the passivation layer 118, the second AlGaN layer 116, the AlN etch stop layer 108, the first AlGaN layer 106, and extend into the GaN channel layer 104. For example, the source metal layer 212 and the drain metal layer 213 may comprise nickel, gold, silver, platinum, titanium, titanium nitride, or any combination thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a substrate;
   a buffer layer over the substrate;
   a GaN layer over the buffer layer;
   a first AlGaN layer over the GaN layer;
   a first AlN layer over the first AlGaN layer;
   a gate recess over the first AlN layer; and
   a p-type GaN layer over the first AlN layer.

2. The HEMT according to claim 1, wherein the first AlGaN layer is a p-type AlGaN layer or an intrinsic AlGaN layer.

3. The HEMT according to claim 1 further comprising a second AlGaN layer over the first AlN layer.

4. The HEMT according to claim 3 further comprising a passivation layer over the second AlGaN layer.

5. The HEMT according to claim 4, wherein the passivation layer comprises aluminum nitride, aluminum oxide, silicon nitride, or silicon oxide.

6. The HEMT according to claim 4, wherein the gate recess penetrates through the passivation layer and the second AlGaN layer.

7. The HEMT according to claim 6, wherein the p-type GaN layer is in direct contact with the first AlN layer in the gate recess.

8. The HEMT according to claim 4, wherein the second AlGaN layer has a thickness greater than that of the first AlGaN layer.

9. The HEMT according to claim 4, wherein the thickness of the second AlGaN layer between 2 nm and 30 nm, and wherein the thickness of the first AlGaN layer between 2 nm and 10 nm.

10. The HEMT according to claim 4, wherein the second AlGaN layer has aluminum content greater than that of the first AlGaN layer.

11. The HEMT according to claim 10, wherein the aluminum content of the second AlGaN layer between 10% and 50%.

12. The HEMT according to claim 11, wherein the aluminum content of the first AlGaN layer between 0 and 30%.

13. The HEMT according to claim 1, wherein the p-type GaN layer is disposed in the gate recess.

14. The HEMT according to claim 1, wherein the gate recess does not penetrate through the first AlN layer, and wherein the gate recess is completely filled with the p-type GaN layer.

15. The HEMT according to claim 1 further comprising a gate metal layer on the p-type GaN layer.

16. The HEMT according to claim 15, wherein the gate metal layer comprises nickel, gold, silver, titanium, copper, platinum or alloys thereof.

17. The HEMT according to claim 15 further comprising a source metal layer and a drain metal layer penetrating through the passivation layer, the second AlGaN layer, the first AlN layer, the first AlGaN layer, and extending into the GaN layer.

18. The HEMT according to claim 17, wherein the source metal layer and the drain metal layer comprise nickel, gold, silver, platinum, titanium, titanium nitride, or any combination thereof.

19. The HEMT according to claim 1 further comprising a second AlN layer on the p-type GaN layer.

20. The HEMT according to claim 1 further comprising a passivation layer, wherein the passivation layer comprises aluminum nitride, aluminum oxide, silicon nitride, or silicon oxide.

21. The HEMT according to claim 1 further comprising a source metal layer and a drain metal layer, wherein the source metal layer and the drain metal layer comprise nickel, gold, silver, platinum, titanium, titanium nitride, or any combination thereof.

* * * * *